(12) United States Patent
Brand et al.

(10) Patent No.: US 8,999,821 B2
(45) Date of Patent: Apr. 7, 2015

(54) FIN FORMATION BY EPITAXIAL DEPOSITION

(71) Applicant: Applied Materials, Inc., Santa Clara, CA (US)

(72) Inventors: Adam Brand, Palo Alto, CA (US);
Bingxi Wood, Cupertino, CA (US);
Errol Sanchez, Tracy, CA (US);
Yihwan Kim, San Jose, CA (US);
Yi-Chiau Huang, Fremont, CA (US);
John Boland, Scotts Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/269,417

(22) Filed: May 5, 2014

(65) Prior Publication Data

US 2015/0050800 A1   Feb. 19, 2015

Related U.S. Application Data

(60) Provisional application No. 61/867,399, filed on Aug. 19, 2013.

(51) Int. Cl.
*H01L 21/20* (2006.01)
*H01L 21/02* (2006.01)
*H01L 29/66* (2006.01)

(52) U.S. Cl.
CPC ...... *H01L 21/0262* (2013.01); *H01L 29/66795* (2013.01)

(58) Field of Classification Search
None
See application file for complete search history.

(56) References Cited

U.S. PATENT DOCUMENTS

2007/0284623 A1 * 12/2007 Kim et al. ............. 257/213

* cited by examiner

*Primary Examiner* — Kyoung Lee
(74) *Attorney, Agent, or Firm* — Kilpatrick Townsend & Stockton LLP

(57) ABSTRACT

Methods of forming a fin structure for a field effect transistor are described. The methods may include the operations of patterning a mandrel on a surface of a substrate, and depositing an epitaxial layer of high-mobility channel material over exposed surfaces of the patterned mandrel. The epitaxial layer leaves a gap between adjacent columns of the patterned mandrel, and a dielectric material may be deposited in the gap between the adjacent columns of the patterned mandrel. The methods may also include planarizing the epitaxial layer to form a planarized epitaxial layer and exposing the columns of the patterned mandrel, and etching at least a portion of the exposed columns of the patterned mandrel and the dielectric material to expose at least a portion of the planarized epitaxial layer that forms the fin structure.

20 Claims, 12 Drawing Sheets

FIN FORMATION BY EPITAXIAL DEPOSITION

CROSS-REFERENCES TO RELATED APPLICATIONS

This application claims the benefit of U.S. Prov. Pat. App. No. 61/867,399 filed Aug. 19, 2013, and titled "FIN FORMATION BY EPITAXIAL DEPOSITION" by Brand et al., which is hereby incorporated herein in its entirety by reference for all purposes.

FIELD

Embodiments of the present invention relate to forming fin structures.

BACKGROUND

As device dimensions continue to decrease in field-effect transistors (FETs), the gate channels between the source and drain regions of these transistors continue to get smaller. The dimensions have now shrunk to a point where short channel effects are creating significant problems for conventional planar FET designs. These short channel effects include a shift in the threshold voltage applied by the gate into the channel region to lower the current-flow barrier to electric charge flowing in the channel region between the source and drain region. Often, this shift in threshold voltage is caused by the voltage in the drain region of the transistor undesirably lowering the current-flow barrier in the channel region independently of the voltage applied by the gate. Another short channel effect is the degradation of the sub-threshold slope that defines the sensitivity of the threshold gate voltage to having the FET in an "on" or "off" position. Still another short channel effect is the greater amount of current flowing between the source and drain region when the FET is supposed to be in the "off" state. These short channel effects become increasingly problematic in planar FETs as the length of the channel region separating the source and drain regions of the transistor continues to decrease with each successive generation on the International Technology Roadmap for Semiconductors.

A further deleterious affect of shortening the channel region is the diminishment of the gate to act as an electrostatic control valve to prevent the leakage of charge from the source to the drain region. This diminishment is noticeably pronounced in planar FETs where the gate region contacts channel region along a single plane. As the channel region continues to shorten with successive generations of FETs, new designs that have the gate contacting the channel region along more than one plane have been developed. One of these designs forms the channel region has a raised strip of semiconductor material connecting the source and drain regions of the FET. The raised strip is colloquially referred to as a "fin", and the device design is called a "finFET". The raised fin channel permits the gate to surround and contact the channel along two or three planes, as opposed to the single plane of contact available to planar FETs.

Conventional methods of manufacturing finFETs include the deposition and etching of a dielectric material on a semiconducting (e.g., silicon) substrate. For example, silicon oxide may be deposited on the substrate surface and then pattern etched to create trenches that are the molds for forming the fin channel regions of the finFETs. Unfortunately, the patterning of the dielectric material and the subsequent pre-cleaning that's typically necessary before depositing the fin material tend to overetch the sidewalls of the trenches, resulting in the fin being wider than desired. These overetching problems become more pronounced as the target width of the fin get smaller (e.g., 5-10 nm). At such small with dimensions, it is not uncommon for the overetching of the trench sidewalls to double the fin width.

Poor control of the etching and pre-clean operations can also result in a significant number of defects in the fin channel material. Because of the small dimensions of the fin channels, even a small number of dislocations, or even point defects, can significantly affect the channel region's ability to both stop and flow current between the source and drain regions of the finFET. Thus, there is a need for new methods of forming the fins of a finFET that provide more dimensional control and fewer defects in the fin. These and other challenges are addressed in the present Application.

SUMMARY

The present application describes methods of forming a fin structure of a field effect transistor (i.e., a finFET) using the epitaxial deposition of a high-mobility channel material over exposed surfaces of the patterned mandrel. Forming the fin structure by an epitaxial deposition similar to forming a spacer layer improves width control of the fin, a parameter that plays a role in device control and variation. The present methods also desensitizes the fin width from line edge roughness on a patterned mandrel. Compared to the replacement channel fin formation approach, it eliminates the need for a mold to define the shape and dimensions of the fin. Consequently, the present methods eliminate the problems of over etching the trench that defines a mold and reduces the number of defects seen in the fin channel.

Embodiments of the invention include methods of forming a fin structure for a field effect transistor. The methods may include patterning a mandrel on a surface of a substrate, and depositing an epitaxial layer of high-mobility channel material over exposed surfaces of the patterned mandrel. The epitaxial layer leaves a gap between adjacent columns of the patterned mandrel, and a dielectric material may be deposited in the gap between the adjacent columns of the patterned mandrel. The methods may also include planarizing the epitaxial layer to form a planarized epitaxial layer and exposing the columns of the patterned mandrel, and etching at least a portion of the exposed columns of the patterned mandrel and the dielectric material to expose at least a portion of the planarized epitaxial layer that forms the fin structure.

Embodiments of the invention may include additional methods of forming a fin structure for a field effect transistor, where the methods include patterning a mandrel on a surface of a substrate. The patterning may include etching a notch into the substrate to expose a sub-surface lattice plane different than a surface lattice plane of the substrate. An epitaxial layer of high-mobility channel material may be deposited over exposed surfaces of the patterned mandrel and the notch in the substrate, where the epitaxial layer forms on a notch surface having the sub-surface lattice plane, and where the epitaxial layer leaves a gap between adjacent columns of the patterned mandrel. The method may further include planarizing the epitaxial layer to form a planarized epitaxial layer and exposing the columns of the patterned mandrel, and etching at least a portion of the exposed columns of the patterned mandrel to expose at least a portion of the planarized epitaxial layer that forms the fin structure.

Embodiments of the invention may include further methods of forming a fin structure for a field effect transistor, where the methods may include etching a substrate to form columns of a patterned mandrel into the substrate, where the mandrel columns comprise the substrate material. The methods may further include depositing an epitaxial layer of high-mobility channel material over exposed surfaces of the mandrel columns, where the epitaxial layer leaves a gap between adjacent mandrel columns. The epitaxial layer may be planarized to form a planarized epitaxial layer that exposes a surface of the mandrel columns. At least a portion of the exposed mandrel columns may be etched to expose at least a portion of the planarized epitaxial layer that forms the fin structure.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION

Methods, device structures and platform configurations are described for forming epitaxially grown fins of fin-containing field effect transistors (i.e., finFETs) having widths controlled by the epitaxial deposition of a high-mobility channel material over exposed surfaces of the patterned mandrel. The present methods depart from conventional finFET fabrication methods that use either direct etching of a semiconductor material, or replacement channel approach using an etched dielectric layer as a mold to define the shape of an epitaxially grown fin on a substrate surface. These replacement methods typically include the etching of a dielectric layer to form the fin mold over the substrate. The substrate itself is often patterned such that the patterned openings in the dielectric layer are aligned over the tops of columns in the patterned substrate. A epitaxially grown fin may then be deposited on top of each substrate column, which acts like a pedestal supporting the fin.

In direct etching of high mobility channel materials, a hardmask and patterning layer stack is used to control the fin width. In direct etching, the precision of the patterning and etch method determining the width control of the fins, which is subject to line edge roughness, variations due to the patterning films, and the patterning method. In the present methods, fin width primarily depends on the uniformity of the epitaxial growth, which is inherently well-controlled.

In conventional replacement fin fabrication methods, native oxide present on the top of the substrate surface needs to be removed to expose the underlying silicon that will act as the seed layer for the epitaxial growth of the fin. Removing the native oxide typically involves a pre-clean operation that introduces oxide etchants (e.g., Siconi etchants) into the opening that defines the shape of the fin. The etchants normally etch away the sidewalls of the patterned silicon oxide layer in addition to the native oxide formed over the surface of the silicon substrate. Etching the silicon oxide sidewalls widens the opening that defines the subsequently deposited fin, making it wider than desired. The present methods avoid this undesirable widening of the fin by avoiding the use of a patterned dielectric mold to define the fin width. In the present methods, the fin width is controlled by the number of epitaxially grown layers of high-mobility channel material are deposited over a patterned mandrel.

Exemplary Methods and Device Structures

Figure 1A:
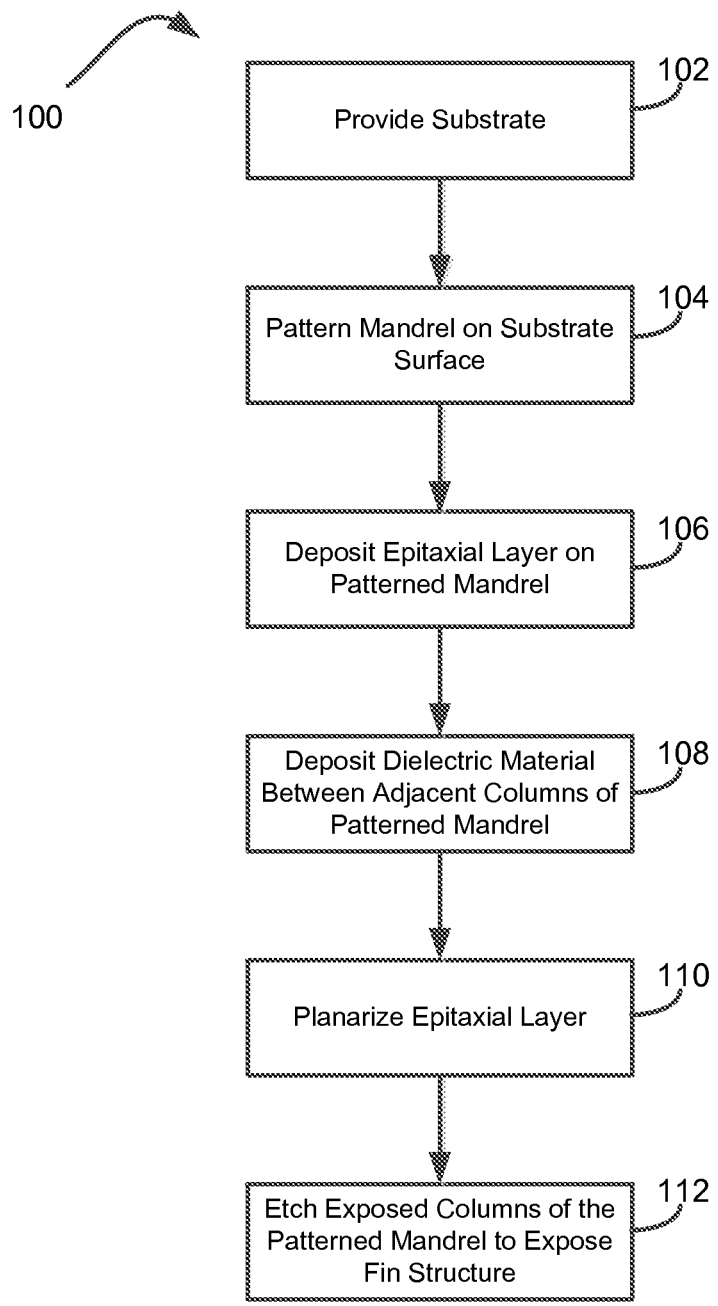
FIG. 1A is a flowchart illustrating selected operations in method of forming a fin structure for a field effect transistor according to embodiments of the invention.

FIG. 1A is a flowchart illustrating selected operations in method 100 of forming a fin structure for a field effect transistor according to embodiments. The method 100 may start with providing the substrate 102 upon which the fin structure is formed. Exemplary substrate materials may include single-material silicon or germanium, among other materials. Exemplary substrate materials may also include substrates made from compound substrate materials having two or more elements such as silicon-germanium; III-V compounds such as gallium nitride (GaN), gallium arsenide (GaAs), indium gallium arsenide (InGaAs), indium antimony (InSb), and indium arsenide (InAs), among other compound substrate materials.

A mandrel material may be deposited on the substrate and patterned to form a patterned mandrel 104. The mandrel material may be a dielectric material such as silicon oxide that can be patterned etched to form discrete columns of mandrel material separated by gaps on the surface of the substrate. The pattern etching of the mandrel material may be done by conventional dielectric etching techniques, such as lithographic patterning of a photoresist material followed by dry etching the exposed regions of the dielectric material down to the substrate surface.

An epitaxially-grown layer of high-mobility channel material may be deposited over the exposed surfaces of the patterned mandrel 106. The high-mobility channel material may include a single material or a compound material such as column IV elements silicon, germanium, and tin, (i.e., Si, Ge, Sn); and column III-V elements such as gallium, arsenic, aluminum, indium, and antimony, (i.e., Ga, As, Al, In, Sb). High-mobility channel materials may also include alloys such as SiGe, GeSn, GaN, GaAs, InGaAs, InP, InAs, AlInSb, InGaSb, and AlGaSb, among other alloyed materials. The thickness of the epitaxial layer may be controlled by the growth rate and growth time for forming the layer. Since these layers will ultimately form the fin structures of finFETs, they are typically grown to a thickness of about 5 nm to about 15 nm. As noted above, the thickness of the epitaxial layer is not defined by an opening in a patterned dielectric layer over substrate surface. Instead, the epitaxial layer is grown to a thickness that still leaves a gap between adjacent columns of the patterned mandrel upon which the epitaxial layer has been grown.

A dielectric material may be deposited in this gap between adjacent columns of the patterned mandrel 108. The dielectric material may be silicon oxide or silicon nitride, among other dielectric materials, and may be deposited by conventional dielectric deposition methods such as plasma-enhance chemical vapor deposition, high aspect ratio process deposition (HARP), high-density plasma deposition (HDP), among other deposition methods. After filling the gaps between the columns of the patterned mandrel with the dielectric material, the device may be planarized to remove a top portion of the epitaxial layer and the deposited dielectric material 110. The planarization operation may be performed using a chemical-mechanical polishing (CMP) technique.

The planarization of the epitaxial layer may expose the tops of the columns of the patterned mandrel. This allows the selective etching of the mandrel material and gap filling dielectric material between adjacent columns of the mandrel to expose the fin structure of the planarized epitaxial layer 112. In some instances the selective etching is a partial etch that leave a portion of the mandrel material and the gap filling dielectric material present on the substrate. In other instances the selective etching may completely remove the mandrel material in the gap filling dielectric material to leave the fin structure exposed down to the interface with the substrate.

Figure 1B:
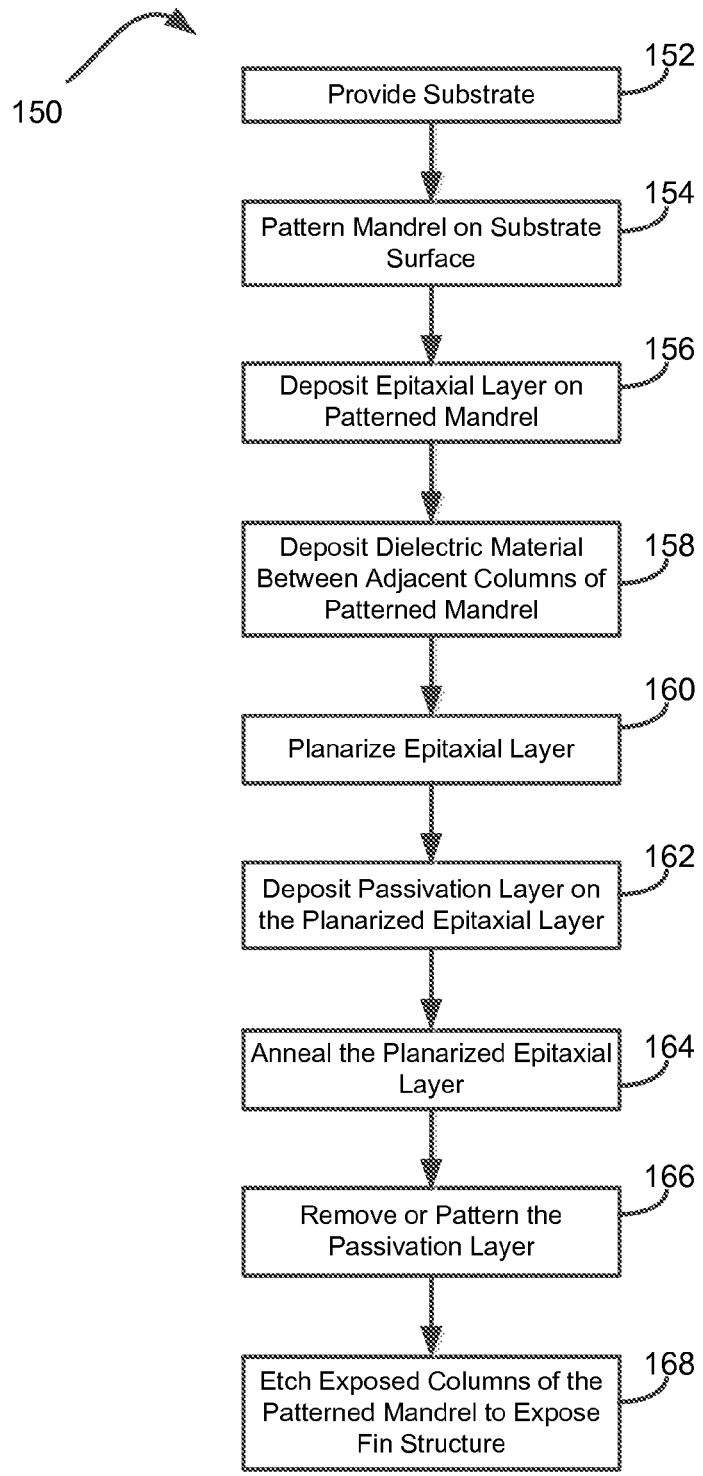
FIG. 1B is a flowchart illustrating selected operations in an additional method of forming a fin structure for a field effect transistor according to embodiments of the invention.

In some embodiments of the present methods, it may be desirable to anneal the epitaxial layer to remove defects in its crystal structure. FIG. 1B is a flowchart illustrating selected operations in additional methods 150 of forming a fin structure for a field effect transistor that include annealing the epitaxial layer. The method 150 may include providing a substrate 152, and forming a patterned mandrel on the substrate surface 154. An epitaxially grown layer of high-mobility channel material may be deposited on the patterned mandrel 156, and a dielectric material may be deposited in the gaps between adjacent columns of the patterned mandrel following the formation of the epitaxial layer 158. The epitaxial layer and gap filling dielectric material may then be planarized 160.

At this stage, a passivation layer may be deposited over the planarized device 162. The passivation layer (also referred to as a "cap layer") may be formed from one or more dielectric materials such as silicon oxide, aluminum oxide, or silicon nitride, among other dielectric materials. The passivation layer prevents the underlying planarized epitaxial layer from being oxidized by gases in the ambient environment as the layer undergoes a crystallization anneal. Once the passivation layer is formed, the device may be annealed to further crystallize the planarized epitaxial layer 164. The anneal may help remove defects and dislocations in the crystal structure of the epitaxial layer, as well as convert polycrystalline regions into a monocrystal.

Following the anneal of the planarized epitaxial layer, the passivation layer may be removed or patterned 164. For example, the passivation layer may be completely removed by an etch or CMP process. In other instances, it may be desirable to leave portions of the passivation layer on the tops of the epitaxial layer while removing other portions that formed over the planarized mandrel material and gap filling dielectric material. For example, the passivation layer formed over the top of the epitaxial layer may form part of the gate stack of the finFET. In these instances, the passivation layer may be patterned to leave the passivation layer on the tops of the epitaxial layer. After the passivation layer has been removed or patterned, the exposed surfaces of the mandrel material and gap filling dielectric material may be etched (i.e., recessed) to expose the fin structure of the epitaxial layer 168.

For the methods described in both FIG. 1A (method 100) and FIG. 1B (method 150), a pre-cleaning operation may be performed to remove any materials contaminating the exposed substrate surface upon which the epitaxial layer will be formed. For example, when the silicon, native oxide buildup on the silicon may be removed in a pre-cleaning operation prior to the epitaxial deposition of the high-mobility channel material to form the epitaxial layer. Unlike conventional methods of forming the fin structure of a finFET, these pre-cleaning operations do not widen an opening in a dielectric material to increase the width of the subsequently deposited epitaxial layer.

Figure 2A:
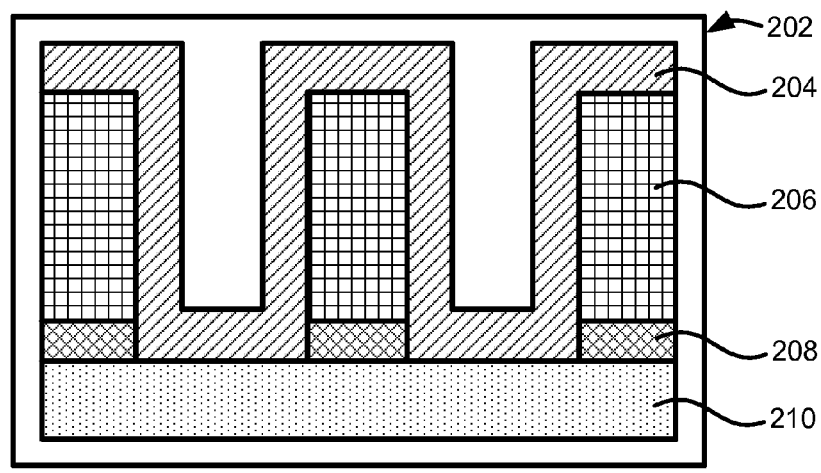
FIGS. 2A, 2B and 2C show schematic cross-sectional views of a device at selected stages of a method of forming a fin structure for a field effect transistor according to embodiments of the invention.
Figure 2B:
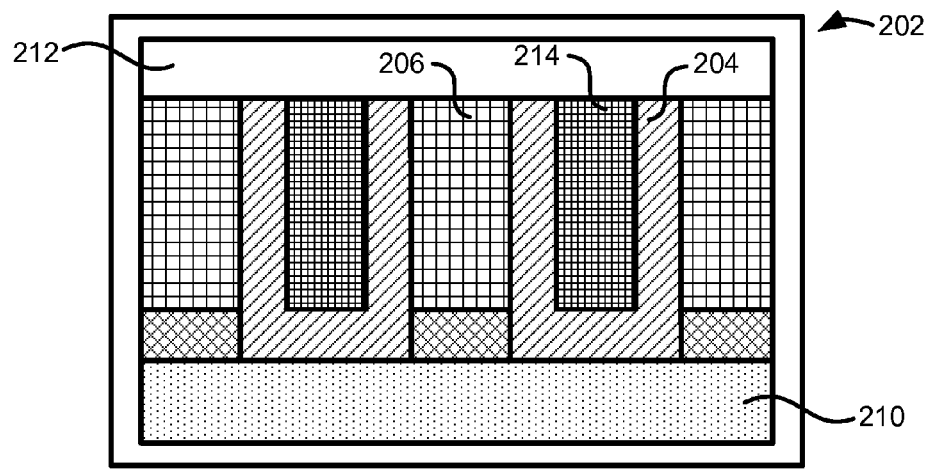
Figure 2C:
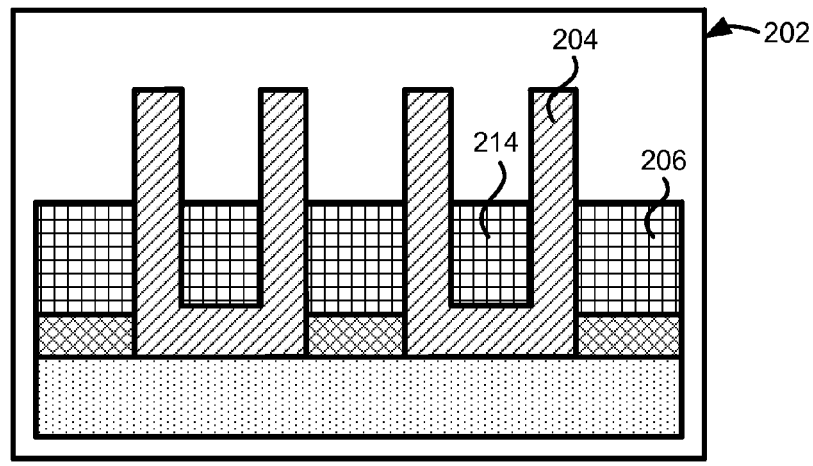

Referring now to FIGS. 2A-C, schematic cross-sectional views of a device at selected stages of a method of forming a fin structure for a field effect transistor in disclosed embodiments is shown. FIG. 2A shows a cross-sectional view of a portion of a device 202 wherein an epitaxial layer of high-mobility channel material 204 is deposited over columns 206 of a patterned mandrel made from silicon oxide. In the embodiment shown, a native oxide layer 208 formed on the surface of the silicon substrate 210 remains between the columns of the mandrel material and the substrate, but has been removed in a pre-cleaning operation where the epitaxial layer 204 makes contact with the silicon substrate 210.

FIG. 2B shows a passivation layer 212 deposited on top of the planarized device 202. The figure also shows a gap filling silicon oxide dielectric material 214 deposited in the gaps between adjacent columns of the patterned mandrel 206. Following the formation of the epitaxial layer 204 and the deposition of the dielectric material 214, the device is planarized to remove a top portion of the epitaxial layer 204 and expose the underlying mandrel 206. The passivation layer 212 is then formed over the planarized epitaxial layer 204 and gap filling dielectric material 214. The passivation layer 212 protects the underlying epitaxial layer 204 as the device 202 undergoes a crystallization anneal.

FIG. 2C shows the device 202 following the anneal, removal of the passivation layer 212, and recessing of the mandrel material 206 and gap fill dielectric material 214. The crystallization anneal has transformed the epitaxial layer 204 from a rough layer containing a significant number of defects and dislocations into a more crystalline annealed layer having a reduced number of defects and dislocations. A selective recess etch removes a portion of the mandrel material 206 and gap fill dielectric material 214 to expose a portion of the epitaxial layer 204 that is the fin portions of what will eventually become the finFETs.

Figure 3:
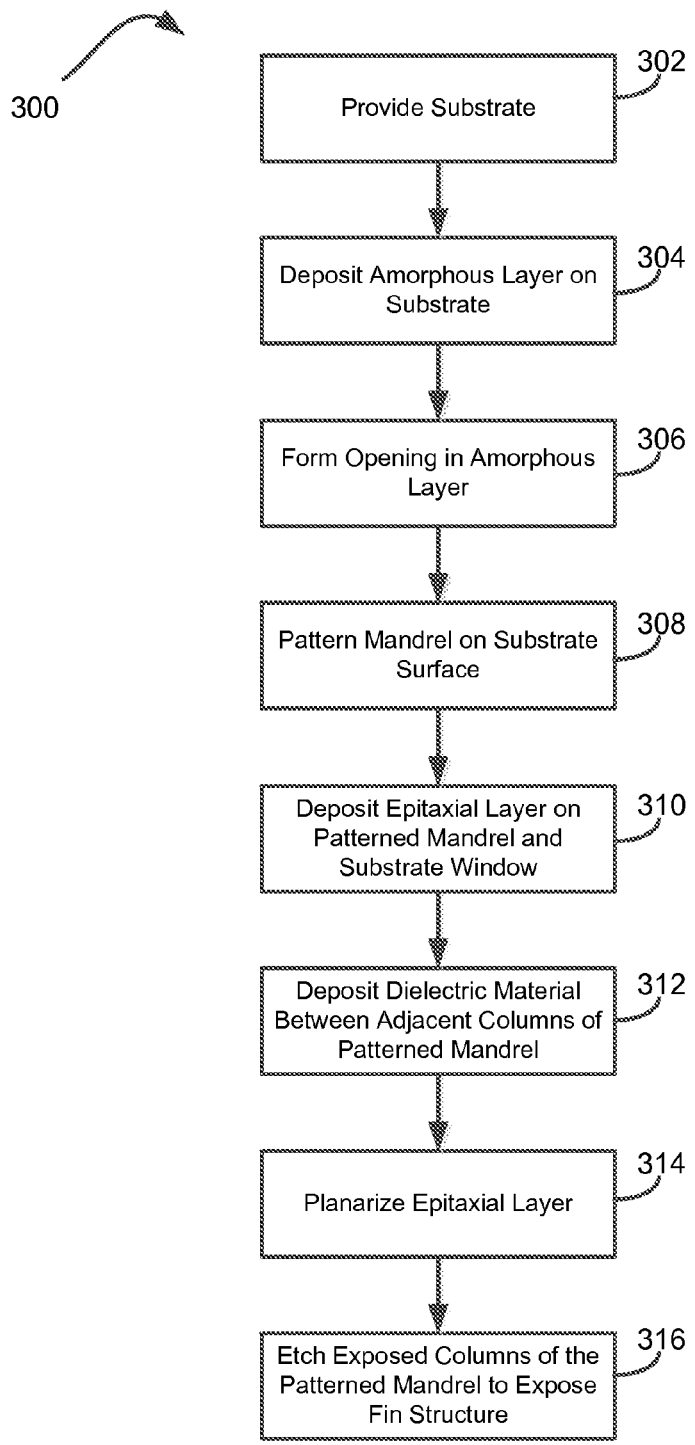
FIG. 3 is a flowchart illustrating selected operations in a method of forming a fin structure for a field effect transistor that further includes a substrate window according to embodiments of the invention.

The interface between the epitaxial layer 204 and the underlying silicon substrate 210 occurs along the entire width of the gap between columns of the patterned mandrel 206. In some instances, it may be desirable to reduce the area of direct contact between the epitaxial layer 204 and the silicon substrate 210 to limit the number of independent crystallization sites that may develop while depositing the epitaxial layer 204. FIG. 3 is a flowchart illustrating selected operations in a method 300 of forming a fin structure for a field effect transistor that further includes a substrate window to limit the area of contact between a substrate and epitaxial layer. The method 300 may include providing a substrate 302, and depositing an amorphous layer on the substrate 304. The amorphous layer may be made from a dielectric material, such as silicon oxide or silicon nitride. Following the deposition of amorphous layer, it may be patterned to form an opening that exposes the underlying substrate 306. The opening constitutes a "substrate window" that provides a reduced area of contact between the substrate and a subsequently deposited epitaxial layer.

With the substrate window formed, a mandrel layer may be deposited and patterned on the substrate surface 308. An epitaxial layer of high-mobility channel material may be formed on the patterned mandrel and the substrate surface exposed by the substrate window 310. The growth of the epitaxial layer is influenced by the surface of the substrate exposed by the substrate window. The exposed substrate surface acts as a seed layer defining the crystallographic orientation of the developing epitaxial layer.

Once the epitaxial layer is formed, a dielectric material may be deposited between the adjacent columns of the patterned mandrel 312. The deposited layers, including the epitaxial layer, may then be planarized 314. Some instances, the mandrel material and gap filling dielectric material exposed by the planarization may be directly etched to expose at least a portion of the fin structure of the epitaxial layer 316. In additional instances (not shown) the planarized layers may be protected by the formation of an overlying passivation layer while the device is annealed to reduce defects and dislocations in the epitaxial layer. The passivation layer may be fully or partially removed in an etch or planarization operation prior to etching the mandrel material and gap filling dielectric material to expose the fin structure.

Figure 4A:
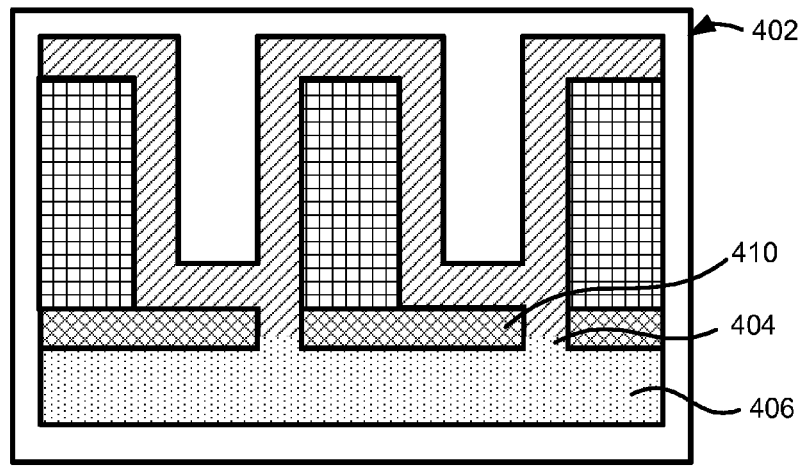
FIGS. 4A, 4B and 4C show schematic cross-sectional views of a device at selected stages of a method of forming a fin structure for a field effect transistor that further includes a substrate window according to embodiments of the invention.
Figure 4B:
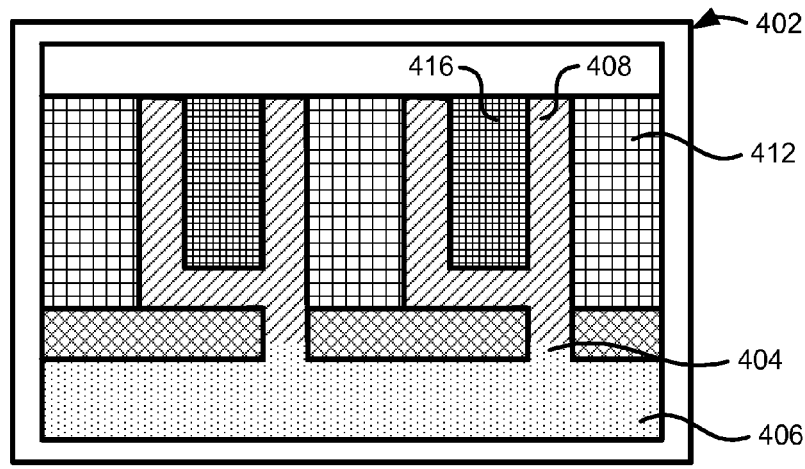
Figure 4C:
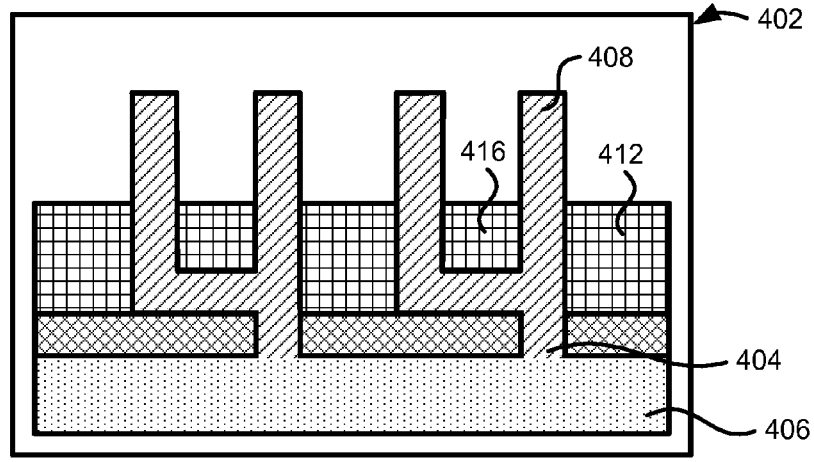

FIGS. 4A-C show schematic cross-sectional views of a device 402 at selected stages of a method of forming a fin structure for a field effect transistor that further includes a substrate window 404 that limits the contact area between the substrate 406 and the epitaxial layer 408. FIG. 4A shows a silicon nitride layer 410 formed on the silicon substrate 406 and patterned to have substrate windows 404 formed adjacent to columns of the patterned mandrel 412. The epitaxial layer 408 formed of a high-mobility channel material (e.g., SiGe, InGaAs, etc.) makes contact with the underlying substrate 406 where the substrate windows 404 are formed. As discussed above, the substrate 406 exposed by the substrate windows 404 act as the seed layer during the growth of the overlying epitaxial layer 408. Because of the amorphous nature of the patterned silicon nitride layer 410, additional crystallization sites do not form where the epitaxial layer 408 is blocked from the substrate 406 by silicon nitride layer 410.

FIG. 4B shows a passivation layer 414 deposited on top of the planarized device 402. The figure also shows a gap filling silicon oxide dielectric material 416 deposited in the gaps between adjacent columns of the patterned mandrel 412. Following the formation of the epitaxial layer 408 and the deposition of the dielectric material 416, the device is planarized to remove a top portion of the epitaxial layer 408 and expose the underlying mandrel 412. The passivation layer 414 is then formed over the planarized epitaxial layer 408 and gap filling dielectric material 416. The passivation layer 414 protects the underlying epitaxial layer 408 as the device 402 undergoes a crystallization anneal.

FIG. 4C the device 402 following the anneal, removal of the passivation layer 414, and recessing of the mandrel material 412 and gap fill dielectric material 416. The crystallization anneal has transformed the epitaxial layer 408 from a rough layer containing a significant number of defects and dislocations into a more crystalline annealed layer having a reduced number of defects and dislocations. A selective recess etch removes a portion of the mandrel material 408 and gap fill dielectric material 416 to expose a portion of the epitaxial layer 498 that is the fin portions of what will eventually become the finFETs.

The substrate is typically made from a crystalline semiconductor material such as silicon or silicon-germanium, among other materials. In the case of silicon substrates, the crystalline orientation of the silicon on the surface exposed to the epitaxial deposition of the high-mobility channel material may depend on how the substrate was formed and cut. Typically, commercially-available silicon substrates have either a (100) or (111) orientation that is not possible to change once the way it is cut. In some instances, it may be desirable to form the epitaxial layer with a different crystallographic orientation than the one defined by the native substrate surface. In these instances it may be possible to etch notches into the surface of the substrate to expose new surfaces with different crystallographic orientations upon which the epitaxial layer can be formed.

Figure 5:
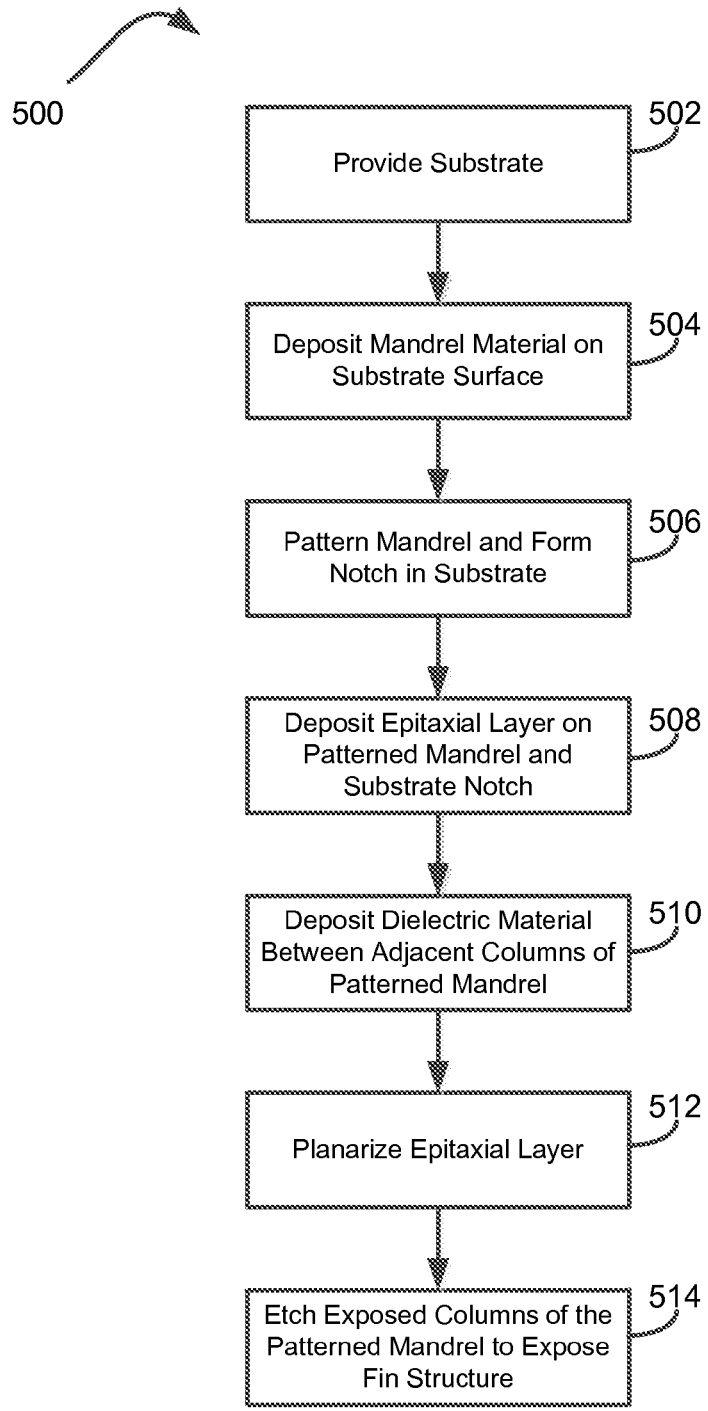
FIG. 5 is a flowchart illustrating selected operations in a method of forming a fin structure for a field effect transistor that further includes forming a notch in the substrate according to embodiments of the invention.

FIG. 5 is a flowchart illustrating selected operations in a method 500 of forming a fin structure for a field effect transistor that further includes forming a notch in the substrate. The method 500 may include providing a substrate 502, and depositing mandrel material on the substrate surface 504. Following the deposition of the mineral material layer, it may be patterned to form isolated columns of patterned mandrel on the substrate surface. The patterning may also include etching the exposed portions of the substrate to form a notch in the substrate 506. The notch is shaped to expose a substrate surface having a different crystallographic orientation than the original, planar substrate surface. For example, if the substrate is silicon with an initial planar surface in the (100) orientation, the notch may expose surfaces having a (111) orientation. Alternatively, if the silicon substrate has an initial planar surface in the (111) orientation, the notch may expose surfaces having a (110) orientation.

Following the formation of the notch in the substrate surface, and epitaxial layer of high-mobility channel material may be deposited over the columns of the patterned and on the exposed, notched surfaces of the substrate 508. The crystallographic orientation of the epitaxial layer will be influenced by the crystallographic orientation of the notched surfaces. For example, the crystallographic orientation of an epitaxial layer formed on the surface of a silicon substrate in the (110)

orientation may be different from the crystallographic orientation of an epitaxial layer formed on a silicon substrate surface having a (100) orientation.

Dielectic material may be deposited between the adjacent columns of the patterned mandrel 510. The deposited layers, including the epitaxial layer, may then be planarized 512. Some instances, the mandrel material and gap filling dielectric material exposed by the planarization may be directly etched to expose at least a portion of the fin structure of the epitaxial layer 514. In additional embodiments (not shown) the planarized layers may be protected by the formation of an overlying passivation layer before or while the device is annealed to reduce defects and dislocations in the epitaxial layer. The passivation layer may be fully or partially removed in an etch or planarization operation prior to etching the mandrel material and gap filling dielectric material to expose the fin structure.

Figure 6A:
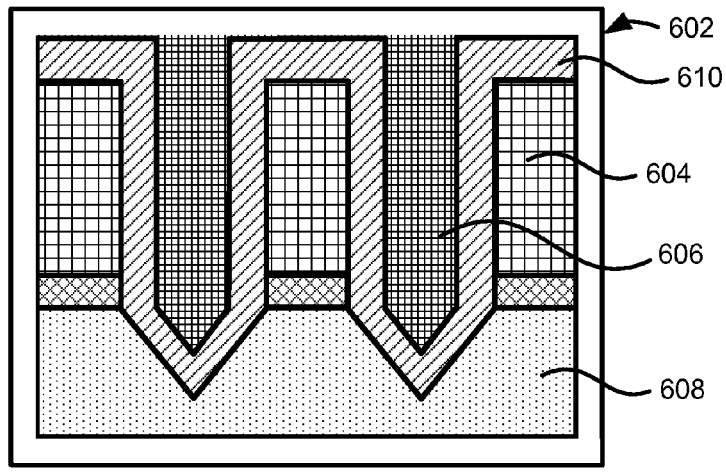
FIGS. 6A, 6B and 6C show schematic cross-sectional views of a device at selected stages of a method of forming a fin structure for a field effect transistor that further includes forming a notch in the substrate according to embodiments of the invention.
Figure 6B:
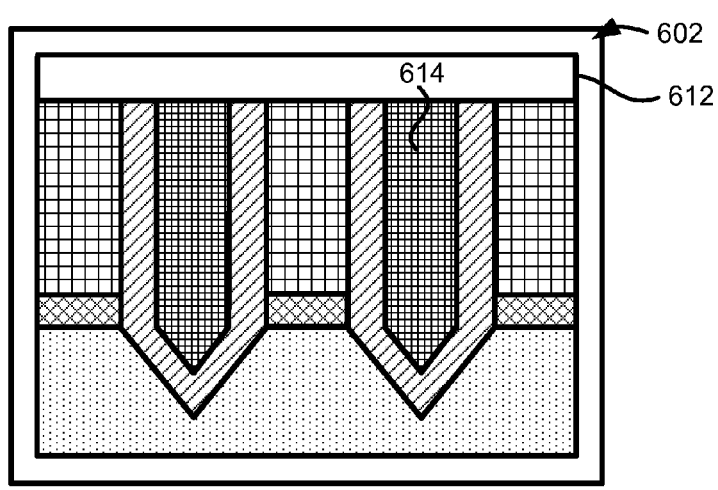
Figure 6C:
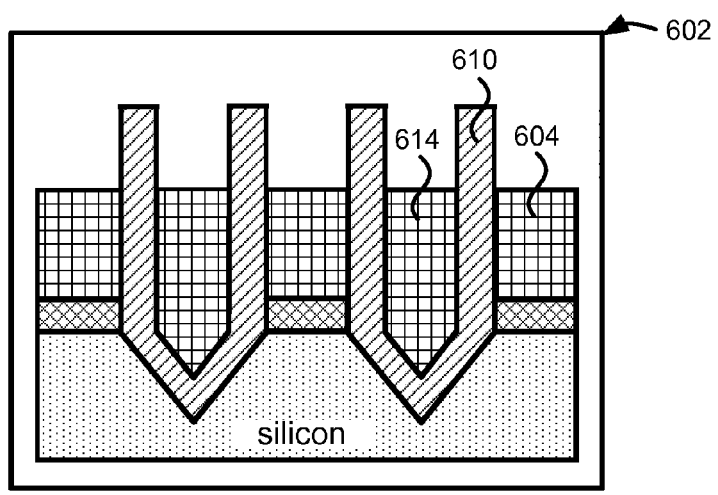

FIGS. 6A-C show schematic cross-sectional views of an exemplary device 602 at selected stages of a method of forming a fin structure for a field effect transistor that further includes forming a notch in the substrate. FIG. 6A shows gaps 603 between columns of the patterned mandrel 604. The bottom of the gaps 603 and with a notch 606 formed in the underlying silicon substrate 608. The shape and pitch of notches 606 are selected to expose a crystallographic orientation in the silicon substrate 608 that is different from the crystallographic orientation exposed on the planar surface of the substrate. An epitaxial layer 610 is then formed over the columns of the patterned mandrel 604 and the silicon substrate 608. The epitaxial layer 610 may have a crystallographic orientation defined by the crystallographic orientation of the silicon substrate 608 exposed by the notch 606. This does not necessarily mean that the epitaxial layer 610 has a crystallographic orientation identical to silicon substrate 608 exposed by the notch 606, but that the silicon substrate in the notch controls the crystallographic orientation of the monolayers of high-mobility channel material which form the epitaxial layer. When the crystallographic orientation of the silicon substrate 608 exposed by the notch 606 is different than the crystallographic orientation of the silicon substrate 608 on the substrate's planar surface, the crystallographic orientation of the epitaxial layer 610 formed on the notch 606 will be different from the crystallographic orientation of an epitaxial layer formed on the substrate surface (not shown).

FIG. 6B shows a passivation layer 612 formed on top of the planarized device 602. The figure also shows a gap filling dielectric material 614 deposited in the gaps 603 between the adjacent columns of the patterned mandrel 604. Following the formation of the epitaxial layer 610 and the deposition of the dielectric material 614, the device 602 is planarized to remove a top portion of the epitaxial layer 610 and expose the underlying columns of the patterned mandrel 604. The passivation layer 612 is then formed over the planarized epitaxial layer 610 and the gap filling dielectric material 614. The passivation layer 612 protects the underlying epitaxial layer as the device 602 undergoes a crystallization anneal.

FIG. 6C shows the device 602 following the anneal, removal of the passivation layer 612, and the recessing of the mandrel material 604 and gap filling dielectric material 614. The crystallization anneal has transformed the epitaxial layer 610 from a rough layer containing a significant number of defects and dislocations, into a more crystalline annealed layer having a reduced number of defects and dislocations. A selective recess etch removes a portion of the mandrel material 604 and the gap filling dielectric material 614 to expose a portion of the epitaxial layer 610 that is the fin portions of what will eventually become the finFETs.

Figure 7:
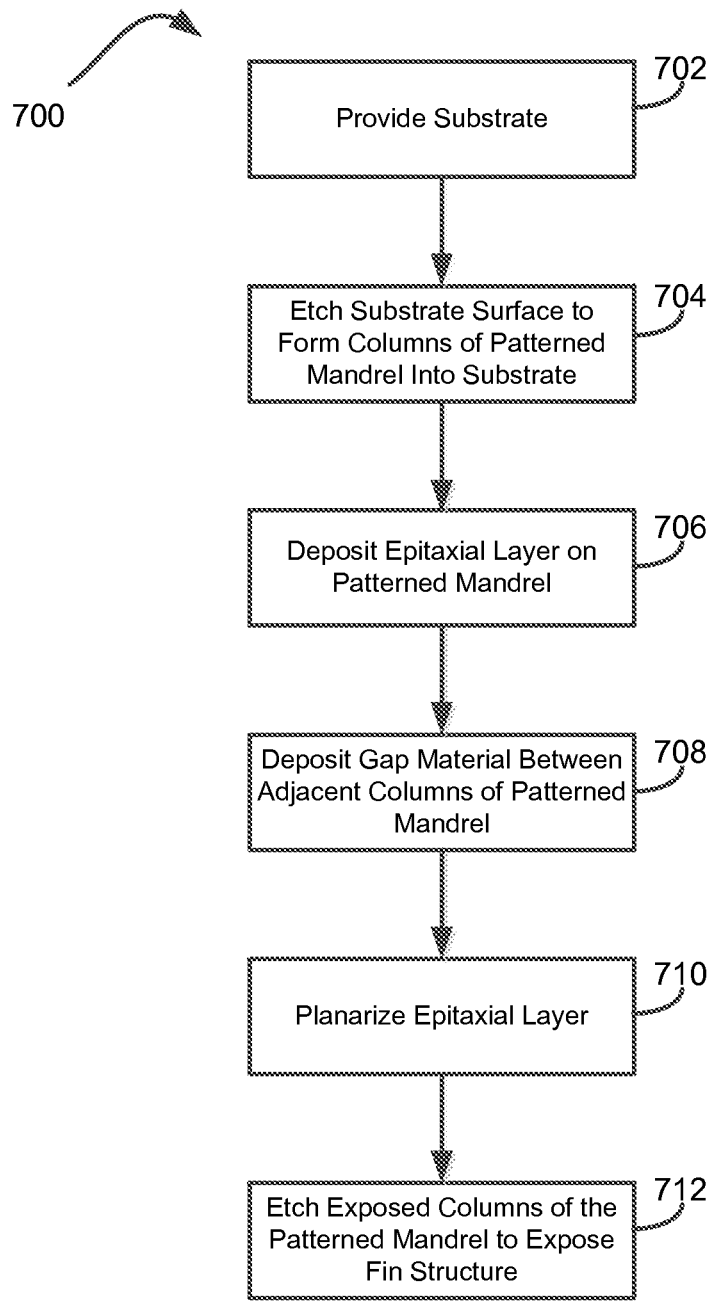
FIG. 7 is a flowchart illustrating selected operations in a method of forming a fin structure for a field effect transistor that further includes forming a mandrel in the substrate according to embodiments of the invention.

Referring now to FIG. 7, a flowchart illustrating selected operations in a method 700 of forming a fin structure for a field effect transistor that further includes forming a mandrel in the substrate is shown. The method 700 may include the operation of providing a substrate 702. The substrate, which may be made from a single-material (e.g., silicon, germanium, etc.) or a plurality of materials (e.g., silicon-germanium, III-V compounds, etc.), is then etched to form columns of a patterned mandrel in the substrate 704. Thus, unlike the methods described above which form the patterned mandrel from a material deposited on the surface of the substrate, method 700 forms the columns of the patterned mandrel from the substrate itself.

Because the columns of the patterned mandrel are formed from the substrate material, the epitaxial layer grown on the substrate mandrel is exposed to the crystallographic orientation of the substrate over a wider area than if the patterned mandrel was formed from a dielectric material on top of the substrate layer. This may reduce the number of defects that tend to increase as the epitaxial layer is grown further away from the interface with the substrate surface. It also allows the lattice of the substrate to be transferred to the whole epitaxial layer region, which can control or introduce strain into the epitaxial layer region over an extensive height that is larger than can be achieved by conventional methods where strain relaxation may limit the fin height.

An epitaxial layer may be deposited on the columns of the patterned mandrel 706. The epitaxial layer may be made from a high-mobility channel material such as silicon, germanium, silicon-germanium (SiGe), and III-V compounds, among other materials. A gap material may be deposited in the gaps between the adjacent columns of the patterned mandrel covered by the epitaxial layer 708. In some instances, the gap material may be compositionally similar to the substrate material (e.g., the gap material may be amorphous silicon when the substrate is made of silicon). In additional instances, the gap material may be a dielectric material such as silicon oxide, silicon nitride, etc. In further instances, the gaps between the adjacent columns of the patterned mandrel maybe left unfilled.

The top of the epitaxial layer may be planarized to expose the top of the columns of the mandrels patterned in the substrate 710. The exposed columns of the mandrel and the gap filling material between the columns (if present) may then be etched back 712. Has these materials are etched back, the fin structure of the planarized epitaxial layer is revealed. In some instances, the columns of the patterned mandrel and the gap filling material may be etched down to the bottom surface of the epitaxial layer, and the gaps between adjacent fin structures partially or fully filled with a dielectric material (e.g., silicon oxide). In additional instances, a passivation layer may be formed over the epitaxially grown fins and dielectric material, followed by a crystallization anneal to reduce the number of defects and dislocations in the epitaxially grown fins. Following the anneal, the passivation layer may be partially or fully removed, and the dielectric material may be etched back to reveal at least a portion of the anneal fins.

Figure 8A:
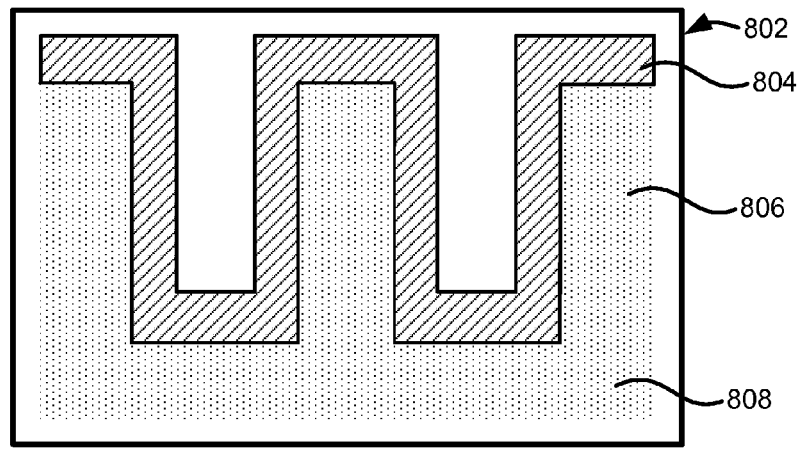
FIGS. 8A, 8B and 8C show schematic cross-sectional views of a device at selected stages of a method of forming a fin structure for a field effect transistor that further includes forming minerals in the substrate according to embodiments of the invention.
Figure 8B:
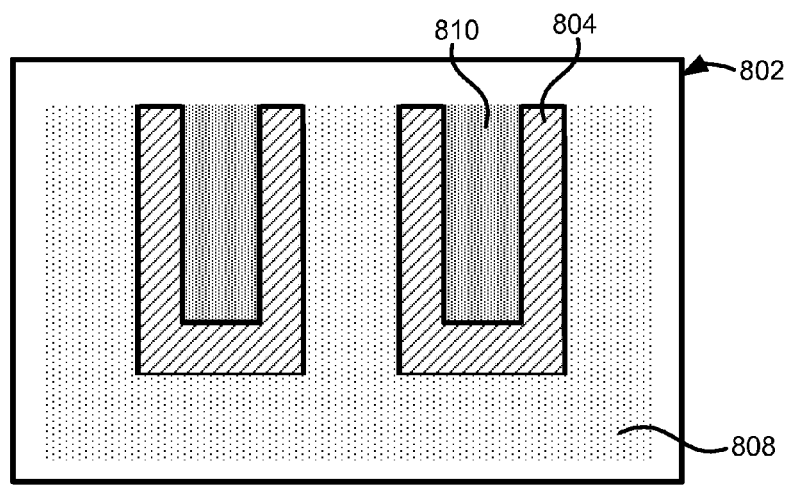
Figure 8C:
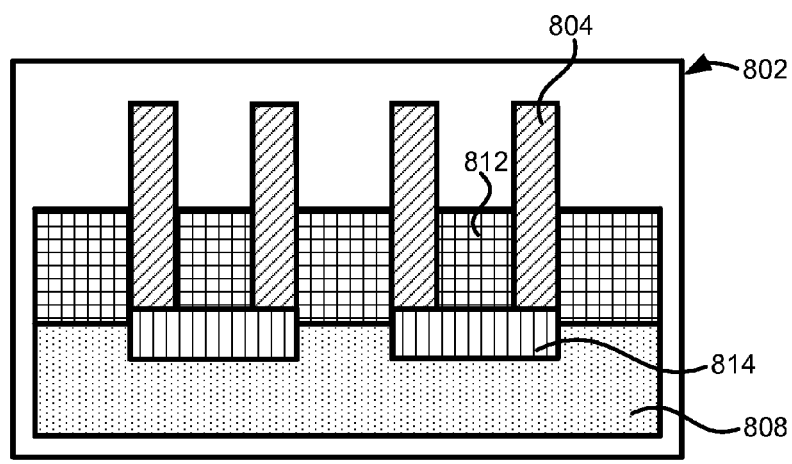

FIGS. 8A-C show schematic cross-sectional views of an exemplary device 802 at selected stages of a method of forming a fin structure for a field effect transistor that further includes forming minerals in the substrate. FIG. 8A shows an epitaxial layer 804 formed on the columns of a patterned mandrel 806 that are formed by a patterned etch in the surface of the substrate 808. In the example shown, the substrate 808 is a silicon substrate, but the columns of the patterned mandrel 806 may be formed in a substrate made from a variety of materials, such as germanium, SiGe, etc.

FIG. 8B shows the gaps 810 between adjacent columns of the patterned mandrel 806 covered with the epitaxial layer 804 filled with a gap filling material. In this illustrated embodiment, the gap filling material is an amorphous silicon that compositionally (but not configurationally) matches the silicon substrate 808. In other words, the amorphous silicon gap filling material is made of silicon like the substrate 808, but has substantially less crystallinity then the substrate. The figure also shows that the device 802 has been planarized to remove a top portion of the epitaxial layer 804 and expose the tops of the columns of the patterned mandrel 806.

FIG. 8C shows the device 802 following the selective etch back of the amorphous silicon gap filling material in the gaps 810 and the columns of the patterned mandrel 806 down to the bottom of the epitaxial layer 804. The figure also shows the deposition of a gap filling material 812 between the vertical fins formed by the planarized epitaxial layer 804. As noted in the discussion of method 700 above, the fins of epitaxial layer 804 may undergo a crystallization anneal. Typically, a passivation layer (not shown) covers the tops of the planarized fins prior to the anneal to prevent the fins from reacting with ambient gases (e.g., oxygen) at raised temperatures during the anneal operation. The fin formation process may also create conditions under which the epitaxial layer 804 in contact with the substrate 808 may react to form an alloyed region 814. The material in the alloyed region 814 is made from a combination of the high-mobility channel material that forms the epitaxial layer 804 and the material that forms the substrate 808 (e.g., Si in the illustrated embodiment).

Exemplary Platform Configurations

Figure 9:
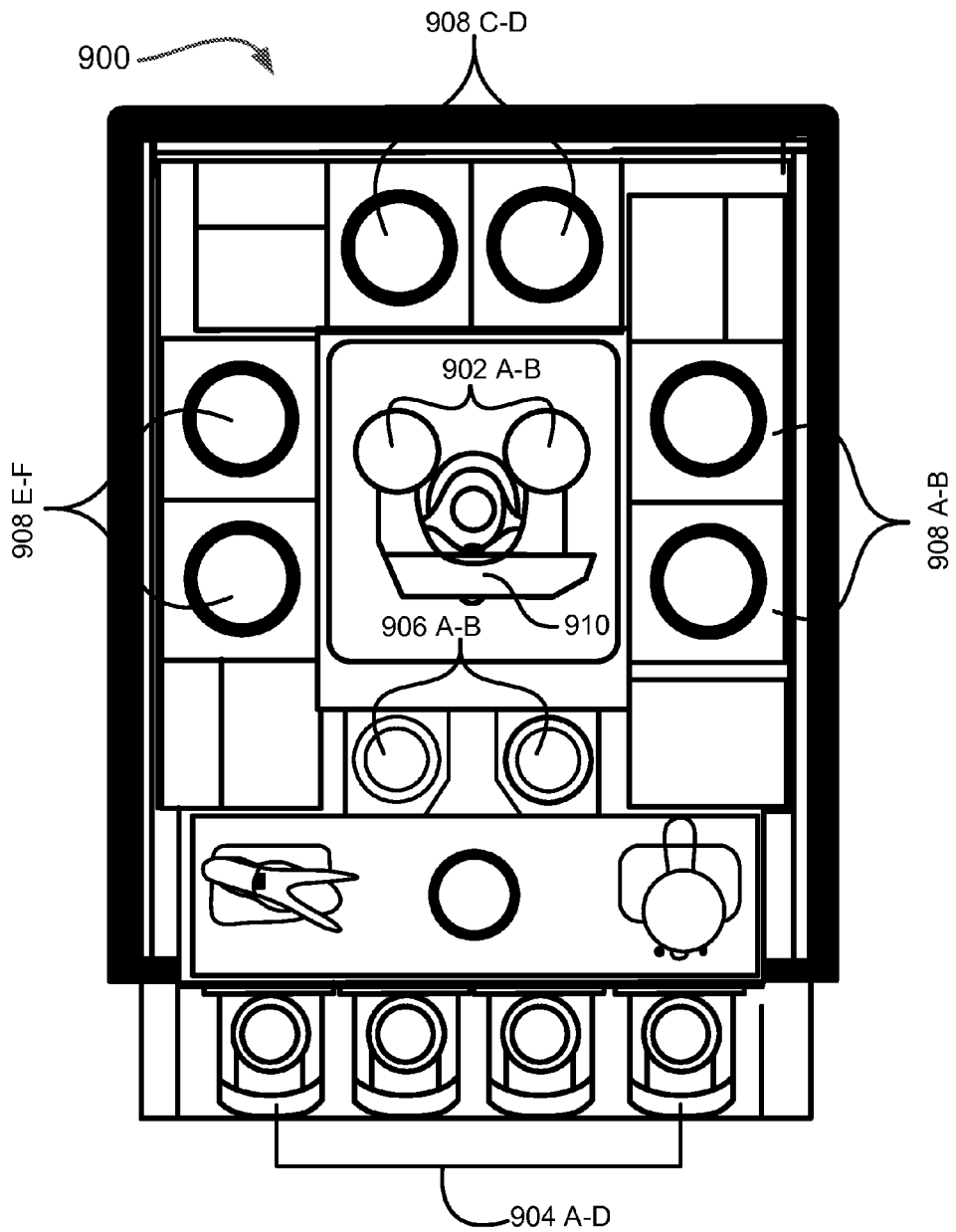
FIG. 9 shows a simplified diagram of a platform having tools for forming epitaxially grown fin structures according to embodiments of the invention.

FIG. 9 shows a simplified diagram of a substrate processing platform 900 having tools for forming epitaxially grown fin structures according to present embodiments. The platform 900 illustrated by figure is capable of accepting two substrate wafers 902a-b simultaneously from two pairs of front opening unified pods ("FOUPs") 904a-d designed to hold a stack of substrate wafers at front- and substrate intake region of the platform 900. The substrate wafers 902 may be received by a pair of robotic arms 904a-b that transport the wafers to low-pressure loading chambers 906a-b. The wafers 902 may be held in the low-pressure loading chambers 906a-b until they are ready to be transported to substrate processing chambers 908a-f by robotic arm 910.

The substrate processing chambers 908a-f may include pairs of chambers used to carry out various operations in the formation of an epitaxially grown fin structure on the wafers 902a-b. These fin structures form a channel region in finFETs of integrated circuit devices. The platform 900 may be configured such that pairs of processing chambers (e.g., 908a-b, 908c-d, and 908e-f) may execute the same process operation simultaneously on the two substrate wafers 902a-b. This allows platform 902 to double the wafer throughput compared to a platform (not shown) that only moves a single wafer through a series of substrate processing chambers.

Exemplary substrate processing chambers 908a-f may include chambers configured with tools to (i) deposit a mandrel material on the substrate surface, (ii) pattern etched the mandrel material to form columns of the patterned mandrel, (iii) deposit an epitaxial layer of high-mobility channel material over exposed surfaces of the patterned mandrel, (iv) deposit dielectric material in gaps between adjacent columns of the patterned mandrel covered with the deposited epitaxial layer, (v) planarize the epitaxial layer, and (vi) etch at least a portion of the columns of the patterned mandrel exposed by the planarization of the epitaxial layer to expose the fins made from the planarized epitaxial layer. The substrate processing chambers 908a-f may also include chambers configured with tools to (i) form a passivation layer over the planarized epitaxial layer, (ii) perform a crystallization anneal of the passivated epitaxial layer, and (iii) remove the passivation layer following the crystallization anneal. Thus, the chambers included in the substrate processing chambers 908a-f may include dielectric deposition chambers, epitaxial deposition chambers, etch chambers, CMP chambers, and anneal chambers, among other types of chambers. The substrate processing chambers 908a-f shown in FIG. 9 may not be configured to carry out all the operations described above for forming the epitaxial fin. In some instances, the substrate processing chambers 908a-f are configured to perform a subset of all the process operations, and the wafers are transported to other chambers or platforms to execute operations before or after those performed on platform 900.

After the substrate wafers 902a-b are sequence through the substrate processing chambers 908a-f, it may be returned to the low-pressure loading chambers 906a-b. From the low-pressure loading chambers 906a-b, the substrate wafers 902a-b may be transported to FOUPs 904a-d where they can be removed from the platform 900.

Figure 10:
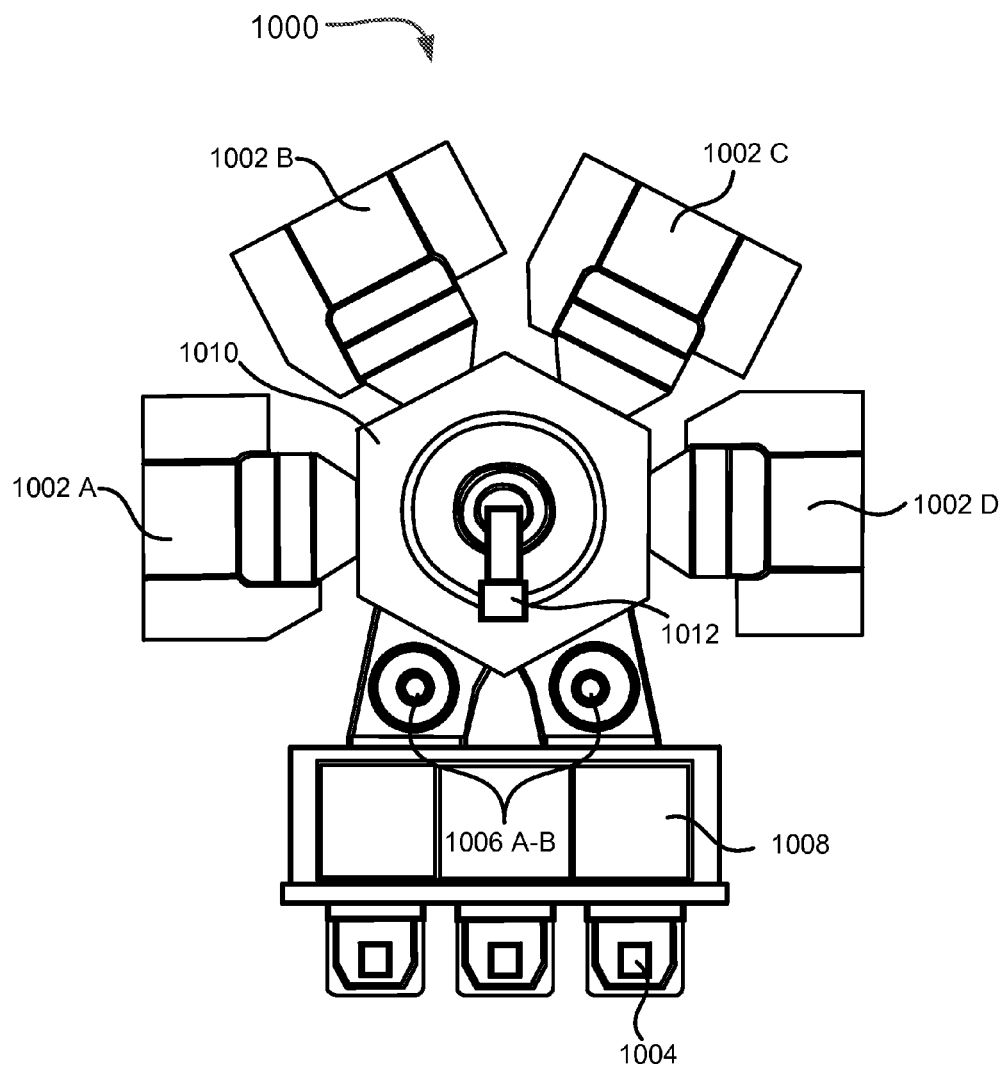
FIG. 10 shows a simplified diagram of another platform having tools for forming epitaxially grown fin structures according to embodiments of the invention.

FIG. 10 shows a simplified diagram of a substrate processing platform 1000 having tools for forming epitaxially grown fin structures according to present embodiments. The platform 1000 shown in the figure includes substrate processing chambers 1002a-d for preparing, depositing, and protecting an epitaxially grown layer of high-mobility channel material that eventually forms the fin components of finFETs. Substrate processing chamber 1002a includes a tool configured to perform a Siconi preclean of the native silicon oxide that may have developed on the exposed surfaces of the substrate wafer. The Siconi process removes these native oxide films, providing an exposed surface of the underlying silicon substrate as the foundation for an epitaxially grown layer of the high-mobility channel material.

The substrate wafer may then be transported to substrate processing chamber 1002b where the epitaxially deposited layer of high-mobility channel material forms on the exposed surfaces of the silicon substrate. Following the deposition of the epitaxial layer, the substrate wafer may be transferred to substrate processing chamber 1002c, where the epitaxial layer (and possibly other layers) are planarized. Thus, substrate processing chamber 1002c may be a CMP chamber, or a blanket etch chamber.

After the deposition and planarization of the epitaxial layer, the substrate wafer may be transferred to substrate processing chamber 1002d where a passivation layer may be deposited over the surface of the planarized epitaxial layer. The passivation layer may be, for example a silicon oxide layer, and aluminum oxide layer, a silicon nitride layer, etc., and may be deposited by atomic layer deposition (ALD) among other deposition techniques. Once the passivation layer has been deposited, the substrate wafer having the planarized and protected epitaxial layer(s) may be returned to FOUPs 1004 four removal from the platform 1000.

The substrate processing platform 1000 may also include chambers and robot arms to aid in the transport of the substrate wafers from the FOUPs 1004 to the substrate processing chambers 1002a-d, as well as between substrate processing chambers. FIG. 10 illustrates these additional chambers and robot arms with, for example, low-pressure loading chambers 1006a-b positioned between the front end chamber 1008 and robot chamber 1010. Robot chamber 1010 houses a robot arm 1012 for moving substrate wafers to and from the low-pressure loading chambers 1006a-b as well as between substrate processing chambers 1002a-d.

Figure 11:
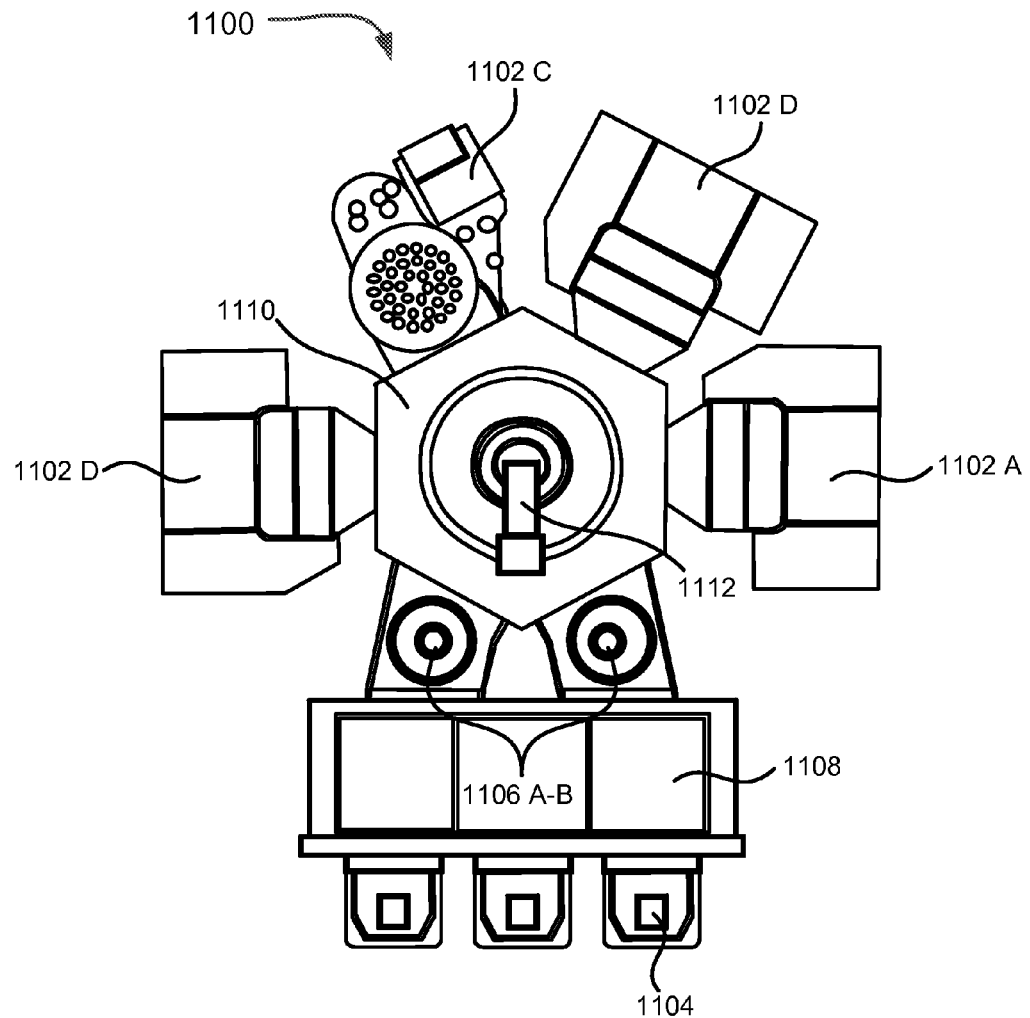
FIG. 11 shows a simplified diagram of a further platform having tools for forming epitaxially grown fin structures according to embodiments of the invention.

FIG. 11 shows another simplified diagram of a substrate processing platform 1100 having tools for forming epitaxially grown fin structures according to present embodiments. The platform 1100 includes substrate processing chambers 1102a-d for protecting an epitaxially grown layer, performing a crystallization anneal on the layer, and etching back materials surrounding the epitaxial layer to expose the fin channels of the finFETs. The platform 1100 includes a substrate processing chamber 1102a for forming a passivation layer on the deposited epitaxial layer, and another substrate processing chamber 1102b to passivated the surface of the substrate wafer.

After the substrate wafer is sequence through substrate processing chambers 1102a-b, it may be transported to substrate processing chamber 1102c wherein a crystallization anneal of the epitaxial layer is performed. After the anneal, the substrate wafer may be transported to substrate processing chamber 1102d, where the passivation layer is removed and other materials they be etched back (i.e., recessed) to reveal the fin structure.

Similar to the platform 1000 illustrated in FIG. 10, the platform 1100 may include chambers and robot arms to aid in the transport of the substrate wafers from the FOUPs 1104 to the substrate processing chambers 1102a-d, as well as between substrate processing chambers. FIG. 11 illustrates these additional chambers and robot arms with, for example, low-pressure loading chambers 1106a-b positioned between the front end chamber 1108 and robot chamber 1110. Robot chamber 1110 houses a robot arm 1112 for moving substrate wafers to and from the low-pressure loading chambers 1106a-b as well as between substrate processing chambers 1102a-d.

Having described several embodiments, it will be recognized by those of skill in the art that various modifications, alternative constructions, and equivalents may be used without departing from the spirit of the invention. Additionally, a number of well-known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or operations, but they do not preclude the presence or addition of one or more other features, integers, components, operations, acts, or groups.

The invention claimed is:

1. A method of forming a fin structure for a field effect transistor, the method comprising:
    patterning a mandrel on a surface of a substrate to form adjacent columns of patterned mandrel;
    depositing an epitaxial layer of high-mobility channel material over exposed surfaces of the patterned mandrel, wherein the epitaxial layer leaves a gap between the adjacent columns of the patterned mandrel;
    depositing dielectric material in a gap between the adjacent columns of the patterned mandrel;
    planarizing the epitaxial layer to form a planarized epitaxial layer and exposing the adjacent columns of the patterned mandrel; and
    etching at least a portion of the adjacent columns of the patterned mandrel and the dielectric material to expose at least a portion of the planarized epitaxial layer that forms the fin structure.

2. The method of claim 1, wherein the method further comprises:
    forming a passivation layer over the planarized epitaxial layer; and
    annealing the planarized epitaxial layer to further crystallize high-mobility channel material that forms the planarized epitaxial layer.

3. The method of claim 2, wherein the method further comprises removing the passivation layer prior to the etching of at least a portion of the exposed adjacent columns of the patterned mandrel and the dielectric material.

4. The method of claim 2, wherein the method further comprises patterning the passivation layer to expose the patterned mandrel and the dielectric material prior to the etching of at least a portion of the exposed adjacent columns of the patterned mandrel and the dielectric material.

5. The method of claim 1, wherein the method further comprises:
    depositing an amorphous layer on the surface of the substrate prior to the patterning of the mandrel on the surface of the substrate; and
    forming an opening in the amorphous layer to expose a portion of the surface of the substrate, wherein the opening provides the epitaxial layer with a window of contact to the surface of the substrate.

6. The method of claim 1, wherein the depositing of the epitaxial layer over the exposed surfaces of the patterned mandrel comprises a non-selective epitaxial deposition.

7. The method of claim 1, wherein the mandrel comprises a dielectric material chosen from at least one of silicon oxide and silicon nitride.

8. The method of claim 1, wherein the epitaxial layer of high-mobility channel material comprises material chosen from at least one of silicon, germanium, SiGe, and III-V semiconductor material.

9. The method of claim 8, wherein the III-V semiconductor material comprises material chosen from at least one of GaP, GaAs, GaSb, InP, InAs, InSb, InGaP, InGaAs, an InGaSb.

10. The method of claim 1, wherein the dielectric material deposited in the gap between adjacent columns of the patterned mandrel comprises a dielectric material chosen from at least one of silicon oxide and silicon nitride.

11. The method of claim 2, wherein the passivation layer comprises a dielectric material chose from at least one of silicon oxide, aluminum oxide, and silicon nitride.

12. A method of forming a fin structure for a field effect transistor, the method comprising:
- patterning a mandrel on a surface of a substrate to form columns of mandrel material, wherein the patterning comprises etching a notch into the substrate to expose a sub-surface lattice plane different than a surface lattice plane of the substrate;
- depositing an epitaxial layer of high-mobility channel material over exposed surfaces of patterned mandrel and the notch in the substrate, wherein the epitaxial layer forms on a notch surface having the sub-surface lattice plane, and wherein the epitaxial layer leaves a gap between adjacent columns of the patterned mandrel;
- planarizing the epitaxial layer to form a planarized epitaxial layer and exposing the columns of the patterned mandrel; and
- etching at least a portion of the exposed columns of the patterned mandrel to expose at least a portion of the planarized epitaxial layer that forms the fin structure.

13. The method of claim 12, wherein the method further comprises:
- depositing a dielectric material in a gap between the adjacent columns of the patterned mandrel and in the notch formed in the substrate; and
- etching at least a portion of the dielectric material to expose at least a portion of the planarized epitaxial layer that forms the fin structure.

14. The method of claim 12, wherein the method further comprises:
- forming a passivation layer over the planarized epitaxial layer; and
- annealing the planarized epitaxial layer to further crystallize high-mobility channel material that forms the planarized epitaxial layer.

15. A method of forming a fin structure for a field effect transistor, the method comprising:
- etching a substrate to form adjacent mandrel columns of a patterned mandrel into the substrate, wherein the adjacent mandrel columns comprise the substrate material;
- depositing an epitaxial layer of high-mobility channel material over exposed surfaces of the adjacent mandrel columns, wherein the epitaxial layer leaves a gap between the adjacent mandrel columns;
- planarizing the epitaxial layer to form a planarized epitaxial layer and exposing a surface of the adjacent mandrel columns; and
- etching at least a portion of the exposed adjacent mandrel columns to expose at least a portion of the planarized epitaxial layer that forms the fin structure.

16. The method of claim 15, wherein the method further comprises:
- depositing a gap material in the gap between the adjacent mandrel columns; and
- etching at least a portion of the gap material to expose at least a portion of the planarized epitaxial layer that forms the fin structure.

17. The method of claim 16, wherein the gap material comprises the same composition as the substrate material, and wherein the gap material has a same or different degree of crystallinity as the substrate material.

18. The method of claim 15, wherein the method further comprises annealing the planarized epitaxial layer to further crystallize high-mobility channel material that forms the planarized epitaxial layer.

19. The method of claim 15, wherein the method further comprises depositing a recess dielectric material in the gap between adjacent mandrel columns following the etching of at least a portion of the exposed adjacent mandrel columns.

20. The method of claim 19, wherein the recess dielectric material comprises a dielectric material chosen from at least one of silicon oxide and silicon nitride.

* * * * *